US012717874B2

(12) United States Patent
Gokmen

(10) Patent No.: US 12,717,874 B2
(45) Date of Patent: Aug. 25, 2026

(54) FACILITATING AUTOMATIC NON-LINEARITY CORRECTION FOR ANALOG HARDWARE

(71) Applicant: International Business Machines Corporation, Armonk, NY (US)

(72) Inventor: Tayfun Gokmen, Briarcliff Manor, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 798 days.

(21) Appl. No.: 17/551,326

(22) Filed: Dec. 15, 2021

(65) Prior Publication Data

US 2023/0185874 A1 Jun. 15, 2023

(51) Int. Cl.

| | |
|---|---|
| ***G06F 17/18*** | (2006.01) |
| ***H03M 1/06*** | (2006.01) |
| *G06F 17/16* | (2006.01) |

(52) U.S. Cl.

CPC .......... *G06F 17/18* (2013.01); *H03M 1/0612* (2013.01); *G06F 17/16* (2013.01)

(58) Field of Classification Search

CPC ......................... G06F 11/2263; H03M 1/0612

See application file for complete search history.

(56) References Cited

U.S. PATENT DOCUMENTS

| | | | |
|---|---|---|---|
| 10,591,536 B1 | 3/2020 | Schat | |
| 10,735,141 B2 | 8/2020 | Bennatan et al. | |
| 10,867,239 B2 | 12/2020 | Gupta et al. | |
| 10,878,317 B2 | 12/2020 | Hatcher et al. | |
| 10,896,368 B2 | 1/2021 | Tran et al. | |
| 10,897,262 B2 | 1/2021 | Kesavanunnithan et al. | |
| 2020/0117699 A1 | 4/2020 | Kim et al. | |
| 2020/0169279 A1 | 5/2020 | Gunturi et al. | |
| 2020/0327287 A1* | 10/2020 | Piveteau | G06F 17/16 |
| 2021/0026916 A1 | 1/2021 | Ulrich | |
| 2021/0105021 A1 | 4/2021 | Tangudu et al. | |

(Continued)

OTHER PUBLICATIONS

Z. He, et al., "Noise Injection Adaption: End-to-End ReRAM Crossbar Non-ideal Effect Adaption for Neural Network Mapping," 2019 56th ACM/IEEE Design Automation Conference (DAC), Las Vegas, NV, USA, 2019. (Year: 2019).*

(Continued)

*Primary Examiner* — Andrew Caldwell

(74) *Attorney, Agent, or Firm* — Amin, Turocy & Watson, LLP

(57) ABSTRACT

Techniques facilitating automatic non-linearity correction for analog hardware are provided. A system can comprise a memory that stores computer executable components and a processor that executes the computer executable components stored in the memory. The computer executable components can comprise an adjustment component that determines a non-linear correction term for an output of an array of analog memories based on a result of a matrix vector multiplication performed on the array of analog memories. The computer executable components can also comprise a rectification component that applies the non-linear correction term to additional outputs of the array of analog memories.

20 Claims, 10 Drawing Sheets

(56) References Cited

U.S. PATENT DOCUMENTS

| | | | |
|---|---|---|---|
| 2021/0124560 | A1 | 4/2021 | Liu et al. |
| 2021/0124795 | A1 | 4/2021 | Phelps et al. |

OTHER PUBLICATIONS

S. Lee, et al., "Learning to Predict IR Drop with Effective Training for ReRAM-based Neural Network Hardware," 2020 57th ACM/IEEE Design Automation Conference (DAC), San Francisco, CA, USA, 2020. (Year: 2020).*
S. Jain, et al., "CxDNN: Hardware-software Compensation Methods for Deep Neural Networks on Resistive Crossbar Systems", ACM Transactions on Embedded Computing Systems (TECS), vol. 18, issue 6, Nov. 2019. (Year: 2019).*
Tsai et al.; "Recent Progress in Analog Memory-Based Accelerators for Deep Learning", Journal of Physics D: Applied Physics, vol. 51, No. 28, pp. 1-27, Jun. 21, 2018.
Roche, "Error Correction in Fast Matrix Multiplication and Inverse", Cornell University Library, arXiv:1802.02270v1, pp. 1-21, Feb. 7, 2018.
Cui et al.; "Towards Memristor Based Accelerator for Sparse Matrix Vector Multiplication", ISCAS IEEE International Symposium on, pp. 1-4, May 22-25, 2016.
Chen et al.; "Multiply Accumulate Operations in Memoristor Crossbar Arrays for Analog Computing", Journal of Semiconductors, vol. 42, No. 1, pp. 1-22, Jan. 2021.
Nahmias et al.; "Photonic Multiply-Accumulate Operations for Neural Networks", JSTQE IEEE Journal of, vol. 26, Issue 1, pp. 1-18, Jan.-Feb. 2020.

* cited by examiner

900

EFFECTIVE RESPONSE AFTER NON-LINEARITY CORRECTION

Y reproduced
802

904

Y corrected
902

40
30
20
10
0
-10
-20
-30
-40

-40 -30 -20 -10 0 10 20 30

FACILITATING AUTOMATIC NON-LINEARITY CORRECTION FOR ANALOG HARDWARE

BACKGROUND

This disclosure relates to non-linearity correction and, more specifically, to correction of a non-linear response from an analog crossbar matrix multiply engine.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments, systems, computer-implemented methods, apparatuses, and/or computer program products that facilitate automatic non-linearity correction for analog hardware are provided.

According to an embodiment, a system can comprise a memory that stores computer executable components and a processor that executes the computer executable components stored in the memory. The computer executable components can comprise an adjustment component that determines a non-linear correction term for an output of an array of analog memories based on a result of a matrix vector multiplication performed on the array of analog memories. The computer executable components can also comprise a rectification component that applies the non-linear correction term to additional outputs of the array of analog memories.

According to another embodiment, a computer-implemented method can comprise determining, by a system operatively coupled to a processor, a non-linear correction term for an output of an array of analog memories based on a result of a matrix vector multiplication performed on the array of analog memories. The method also can comprise applying, by the system, the non-linear correction term to additional outputs of the array of analog memories.

According to a further embodiment, a computer program product that facilitates non-linearity correction for analog hardware, the computer program product comprising a computer readable storage medium having program instructions embodied therewith, the program instructions can be executable by a processing component to cause the processing component to determine a non-linear correction term for an output of an array of analog memories based on a result of a matrix vector multiplication performed on the array of analog memories. The program instructions also can be executable by a processing component to cause the processing component to apply the non-linear correction term to additional outputs of the array of analog memories.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Figure 1:
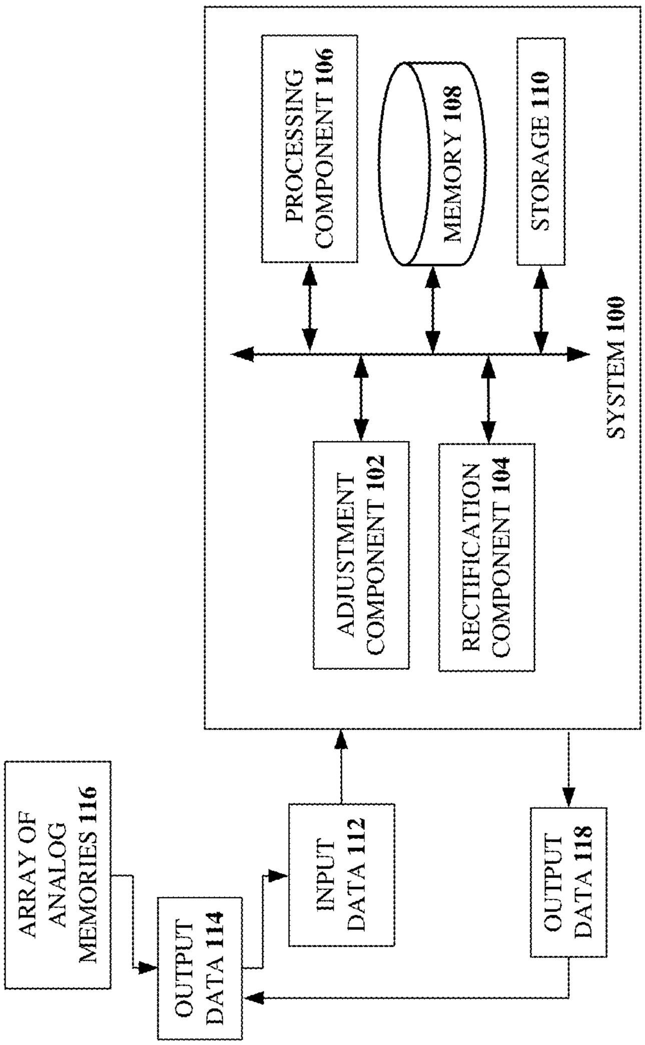
FIG. 1 illustrates a block diagram of an example, non-limiting, system that facilitates detection and correction of non-linear responses from analog hardware in accordance with one or more embodiments described herein.

FIG. 1 illustrates a block diagram of an example, non-limiting, system 100 that facilitates detection and correction of non-linear responses from analog hardware in accordance with one or more embodiments described herein. Aspects of systems (e.g., the system 100 and the like), apparatuses, or processes explained in this disclosure can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform the operations described.

In various embodiments, the system 100 can be any type of component, machine, device, facility, apparatus, and/or instrument that comprises a processor and/or can be capable of effective and/or operative communication with a wired and/or wireless network. Components, machines, apparatuses, devices, facilities, and/or instrumentalities that can comprise the system 100 can include tablet computing devices, handheld devices, server class computing machines and/or databases, laptop computers, notebook computers, desktop computers, cell phones, smart phones, consumer appliances and/or instrumentation, industrial and/or commercial devices, hand-held devices, digital assistants, multimedia Internet enabled phones, multimedia players, and the like.

In various embodiments, the system 100 can be a computing system associated with technologies such as, but not limited to, circuit technologies, processor technologies, computing technologies, artificial intelligence technologies, medicine and materials technologies, supply chain and logistics technologies, financial services technologies, and/or other digital technologies. The system 100 can employ hardware and/or software to solve problems that are highly technical in nature (e.g., receive input data that represents an output of an array of analog memories, perform processing on the input data such that a linear response is decoupled from a non-linear response, determine a non-linear error correction term, and apply the non-linear error correction term to additional outputs of the array of analog memories, and so forth), that are not abstract and that cannot be performed as a set of mental acts by a human. Further, in certain embodiments, some of the processes performed can be performed by one or more specialized computers (e.g., one or more specialized processing units, a specialized computer with an adjustment component, a rectification component, and so on) to carry out defined tasks related to decoupling, from input data, one or more non-linear responses from one or more linear responses for facilitating automatic non-linearity correction for analog hardware.

The system 100 and/or components of the system 100 can be employed to solve new problems that arise through advancements in technologies mentioned above, computer architecture, and/or the like. The system 100 (and other embodiments discussed herein can receive a matrix of data as the input data and perform the decoupling on the matrix of data, where a size of the matrix of data is a function of a number of rows and a number of columns associated with the array of analog memories.

One or more embodiments of the system 100 can provide technical improvements to computing systems, circuit systems, processor systems, artificial intelligence systems, and/or other systems. One or more embodiments of the system 100 can also provide technical improvements to a processor by improving processing performance of the processor, improving processing efficiency of the processor and/or improving processing characteristics of the processor.

In the embodiment shown in FIG. 1, the system 100 can comprise an adjustment component 102, a rectification component 104, a processing component 106, a memory 108, and/or a storage 110. The memory 108 can store computer executable components and instructions. The processing component 106 (e.g., a processor) can facilitate execution of the instructions (e.g., computer executable components and corresponding instructions) by the adjustment component 102, the rectification component 104, and/or other system components. As shown, in some embodiments, one or more of the adjustment component 102, the rectification component 104, the processing component 106, the memory 108, and/or the storage 110 can be electrically, communicatively, and/or operatively coupled to one another to perform one or more functions of the system 100.

The adjustment component 102 can receive, as input data 112, output data 114 from an array of analog memories 116. The array of analog memories 116 can be, for example, analog memories of an analog device. For example, the analog device can be, but is not limited to, analog crossbar arrays associated with an analog crossbar matrix multiply engine.

The output data 114 from the array of analog memories 116 can be based on a result of a matrix vector multiply performed on the array of analog memories 116. Further the output data 114 can include one or more linear response signals integrated with one or more non-linear response signals. For example, the output data 114 can be based on a set of matrix-vectors that are performed on an analog array (e.g., an analog tile). The set of matrix-vectors can be performed using random inputs (X). The result of the measurements (Y) are the output data 114 (e.g., output of the tile).

For example, resistive devices are utilized to execute matrix-vector multiply. If the resistive devices are operating in a linear fashion, the matrix multiply can be directed, based on the inputs to the matrix vector multiply, as voltage signals and then the signals can be read out (e.g., the output data 114) as current or integrated charge. However, this assumes the response of the system is linear (e.g., a perfect vector matrix multiply engine). In practice, however, hardware of the analog device (e.g., the vector matrix multiply engine) can introduce diverse non-linear responses, which is transferred to the output (e.g., the output data 114). This non-linear response can be introduced by the input circuitry, the analog device, an analog to digital converter (ADC), integration circuitry, the reading circuitry, and so on. The non-linear portion is on top of (or integrated with) the linear portion, where the linear portion is the intended result.

Thus, as discussed herein, the non-linear portion and the linear portion of the output data 114 should be decoupled. Upon or after the decoupling, non-linearity correction can be applied. Accordingly, based on the input data 112, the adjustment component 102 determines a non-linear correction term for the output data 114 of the array of analog memories 116.

For example, the linear response of the tile can be extracted by performing linear regression with X (the one or more random inputs) and Y (the output data 114), according to the following equation:

$$\hat{W} = \left((XX^T)^{-1}XY^T\right)^T. \qquad \text{Equation 1}$$

where Ŵ is the linear component of the output data 114, T is transpose, and −1 is the inverse of the matrix.

The correction term can be determined based on the following equation:

$$\text{Error} = Y - \hat{W}X. \qquad \text{Equation 2}$$

Thus, a straight-forward non-linear correction term can be determined and the rectification component 104 applies the non-linear correction term, as output data 118, to additional outputs (e.g., output data 114) of the array of analog memories 116. Thus, the error can be parametrized using Y (e.g., Parametrize Error using Y). For example, an inverse function can be written to each output line to correct for the error (corresponding to non-linear responses of the readout circuitry).

It is to be appreciated that the system 100 (e.g., the adjustment component 102, the rectification component 104, as well as other system components) performs decoupling of linear responses from non-linear responses of a matrix of data. For example, if an array of memories is a 200×300 array, an input to the array of memories is a single vector input that can be a random population of the 200 input lines. The output will be all 300 output readings. Since this is a single vector multiply matrix, the measurement will be repeated for each input signal. For example, if there are 10,000 input signals to test the system, there will be 2,000, 000 signals (10,000 input signals times 200 input lines) applied at the input. Further, there will be 3,000,000 signals (10,000 input signals times 300 output lines) at the output. In some cases, there can be more or less than 10,000 input signals depending on the granularity of the result and the amount of processing time.

Thus, an amount of data processed, a speed of data processed, and/or data types of data processed by the system 100 (e.g., the adjustment component 102, the rectification component 104, and/or other system components) over a certain period of time can be greater, faster, and different than an amount, speed, and data type that can be processed by a single human mind over the same period of time. The system 100 can also be fully operational towards performing one or more other functions (e.g., fully powered on, fully executed, etc.) while also performing the above-referenced non-linearity error correction. Moreover, the output data 118 generated and coordinated by the system 100 (e.g., the adjustment component 102, the rectification component 104, and/or other system components) can include information that is impossible to obtain manually by a user. For example, a type of information included in the input data 112, a variety of information associated with the input data 112, communication with one or more sources providing the input data 112, and/or optimization of the input data utilized to facilitate application of a non-linear correction term to additional outputs of the array of analog memories as the output data 118 can be more complex than information that can be obtained manually and processed by a user.

Figure 2:
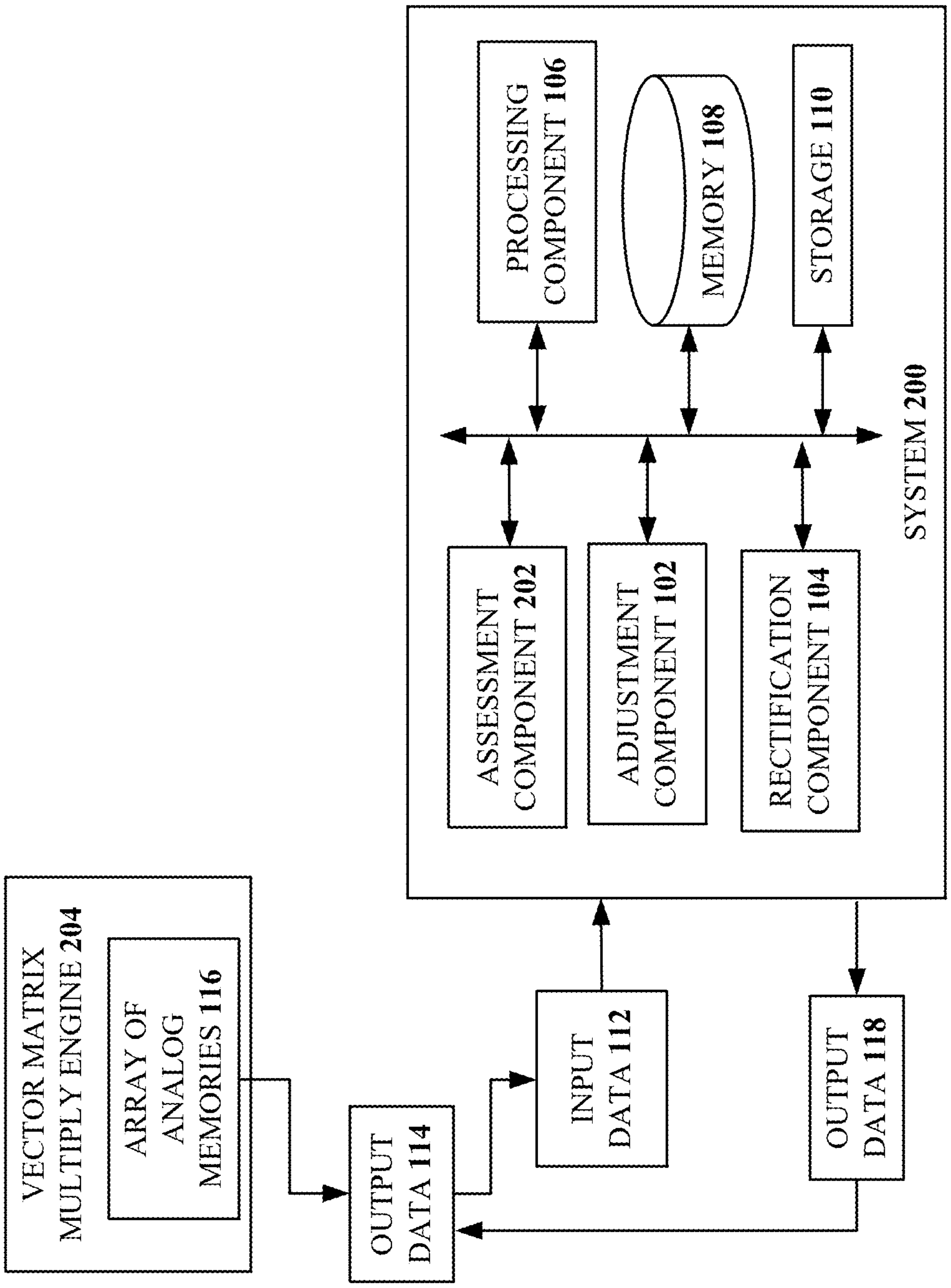
FIG. 2 illustrates a block diagram of an example, non-limiting, system that facilitates application of a non-linear correction term to outputs of an array of analog memories in accordance with one or more embodiments described herein.

FIG. 2 illustrates a block diagram of an example, non-limiting, system 200 that facilitates application of a non-linear correction term to outputs of an array of analog memories in accordance with one or more embodiments described herein. Repetitive description of like elements employed in other embodiments described herein is omitted for sake of brevity. The system 200 can comprise one or more of the components and/or functionality of the system 100, and vice versa.

As discussed herein, provided is detection and correction of a non-linear response associated with an array of analog memories. According to one or more embodiments, the non-linear response can be detected and corrected regardless of the source (e.g., input circuitry, the device, reading circuitry, and so on) of the non-linear response. Further, the correction is applied after an analog-to-digital conversion in the digital domain The system 200 includes an assessment component 202 that performs a matrix vector multiplication on the array of analog memories 116. For example, the assessment component 202 can perform the matrix vector multiplication based on random inputs being applied at input lines of the array of analog memories 116. The quantity of random inputs applied at the input lines can be based on a desired granularity of the correction term.

For example, more random inputs result in more granularity, while fewer random inputs result in less granularity. In an example of a 200×300 array, if there are 1,000 random inputs (e.g., input signals) applied by the assessment component 202 at the 200 input lines, there will be 200,000 signals (1,000 input signals times 200 input lines) applied at the input. Further, there will be 300,000 signals (1,000 input signals times 300 output lines) at the output. If more granularity is desired, more random inputs are applied (e.g., 10,000 random inputs). This will result in 2,000,000 signals at the input and 3,000,000 signals at the output. Thus, in the second example there is more data that can be utilized, which results in a more accurate determination of the non-linear correction term.

Although discussed with respect to a specific number of random input signals, any other number of input signals can be utilized with the disclosed embodiments. However, it is noted an increase in the number of random input signals has a corresponding increase in the amount of processing time to determine and apply the non-linear correction term as discussed herein.

For purposes of explanation and not limitation, a vector matrix multiply engine 204 comprises the array of analog memories 116. Based on the one or more random inputs, the vector matrix multiply engine 204 performs a matrix vector multiplication on the array of analog memories 116. The results are output as the output data 114. The random inputs to the array of analog memories 116 is represented as X, and the output data 114 is represented as Y. The adjustment component 102 evaluates the X and Y results (e.g., one or more matrices) and determines a function, which is the linear portion of the system. Using a linear fitting function, which is a high dimensional linear derivation problem, on additional outputs of the array of analog memories 116, the additional output can be forced fitted such that the non-linear response is removed, or effectively neutralized by the non-linear correction term, as discussed herein.

Figure 3:
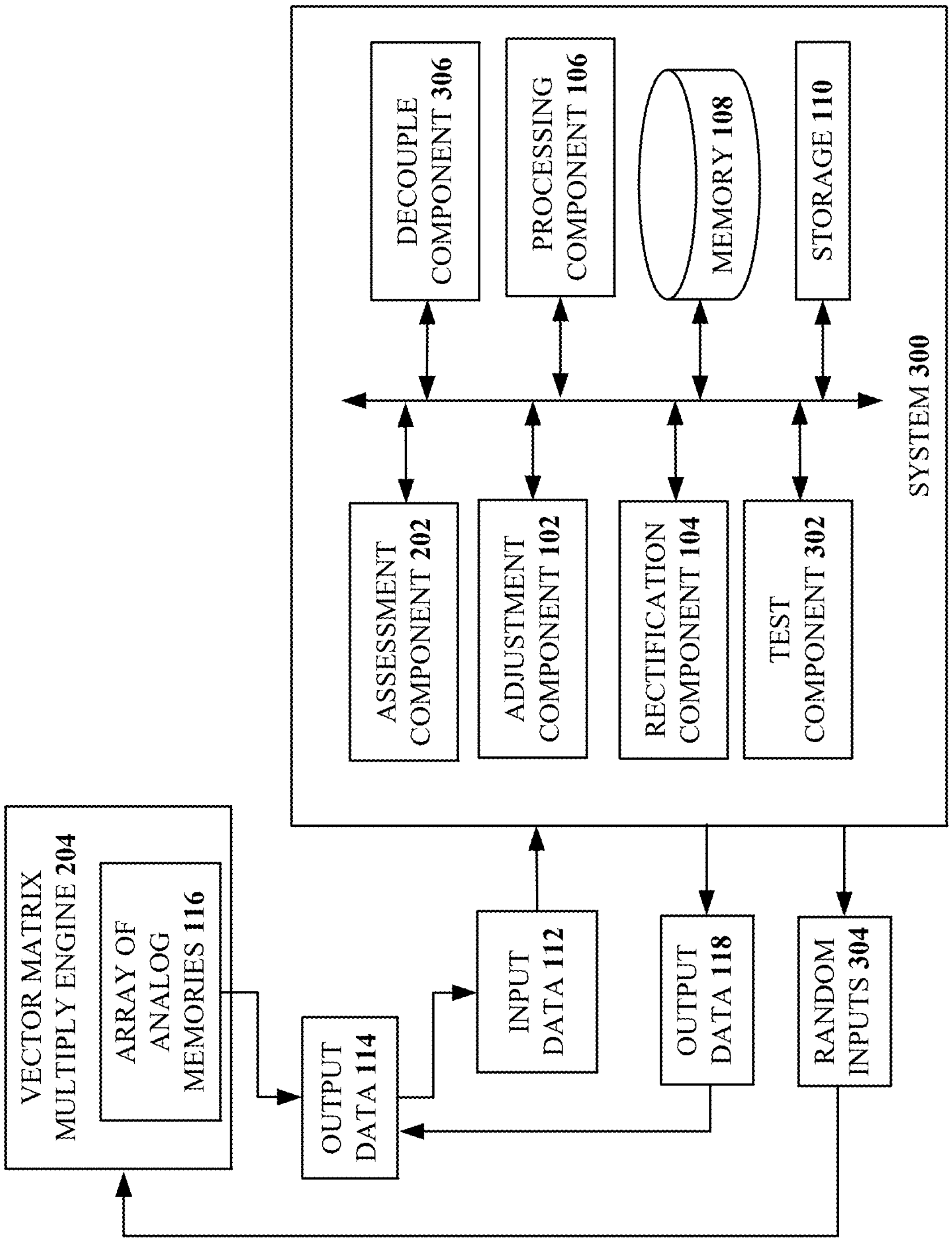
FIG. 3 illustrates a block diagram of an example, non-limiting, system that facilitates non-linearity correction for analog hardware in accordance with one or more embodiments described herein.

FIG. 3 illustrates a block diagram of an example, non-limiting, system 300 that facilitates non-linearity correction for analog hardware in accordance with one or more embodiments described herein. Repetitive description of like elements employed in other embodiments described herein is omitted for sake of brevity. The system 300 can comprise one or more of the components and/or functionality of the system 100, the system 200, and vice versa.

As illustrated, a test component 302 can send one or more random inputs 304 to the analog hardware (e.g., the array of analog memories 116 of the vector matrix multiply engine 204). The one or more random inputs 304 are applied to each input line of the array of analog memories 116. As discussed above, the quantity of the one or more random inputs 304 can be based on a defined granularity associated with the automatic non-linearity correction and/or based on a defined processing time.

The assessment component 202 performs, or facilitates performance of, the matrix vector multiplication on the array of analog memories 116 based on the one or more random inputs 304. Thus, if there are 10,000 random inputs, each input line of the array of analog memories is supplied with the 10,000 random inputs. Upon or after the matrix vector multiplication is performed, output lines of the array of analog memories 116 comprise outputs associated with those 10,000 random inputs. If there are 100,000 random inputs at each input line the input lines, then there are 100,000 outputs (e.g., the output data 114) at each output line of the output lines of the array of analog memories 116.

The output data 114 (and corresponding input data 112) comprise one or more linear response signals integrated with one or more non-linear response signals. A decouple component 306 can decouple the one or more linear response signals from the one or more non-linear response signals. For example, the decouple component 306 can perform linear regression on the input signal (e.g., the one or more random inputs 304) and the output signal (e.g., the output data 114) in order to decouple the linear response signal from the non-linear response signal.

The adjustment component 102 determines a non-linear correction term for the output signal (e.g., the output data 114) of the array of analog memories 116 based on a result of the matrix vector multiplication performed by the test component 302 on the array of analog memories 116. For example, the one or more random inputs X (e.g., the random inputs 304) and the results Y, which are the output signal (e.g., the output data 114) are analyzed.

The analog hardware (e.g., the array of analog memories 116 of the vector matrix multiply engine 204) can be designed to perform matrix-vector multiply using an analog array. The expected response of the hardware y can be equal to Wx (y=Wx), where W represents the linear component of the output data, x represents the random inputs, and y represents the output data. However, non-linear response of the peripheral circuitry introduces non-linear response to the expected response of the hardware. Accordingly, the actual or real response of the hardware y is equal to Wx plus a function of the non-linear response (y=Wx−f-nonlinear). The function of the non-linear response (f-nonlinear) can be very specific to the hardware. Further, the function of the non-linear response (f-nonlinear) can be very specific to each output line of the array of analog memories 116.

Accordingly, the system 300 can perform a set of matrix-vectors on the analog tile (using random inputs, X) and collect the results of these measurements Y (output of the tile). The linear response of the tile is extracted by performing linear regression with X and Y, using equation 1 and equation 2 above. A non-linear correction term can be written to the remaining non-linear response. Further, an inverse function can be written to each output line to correct for the error, which can correspond to the non-linear response of the readout circuitry.

In certain embodiments, the adjustment component 102 can perform the determination of the non-linear correction term, which can be applied by the rectification component 104 as the output data based on classifications, correlations, inferences and/or expressions associated with principles of artificial intelligence. For instance, the adjustment component 102, the assessment component 202, as well as other system components, can employ an automatic classification system and/or an automatic classification process to determine which signals of the one or more output signals represent a linear portion and which signals of the one or more output signals represent a non-linear portion.

In one example, the adjustment component 102 and/or the assessment component 202 can employ a probabilistic and/or statistical-based analysis (e.g., factoring into the analysis utilities and costs) to learn and/or generate inferences with respect to classification and decoupling of the one or more signals. In an aspect, the adjustment component 102 and/or the assessment component 202 can comprise an inference component (not shown) that can further enhance automated aspects of the adjustment component 102 and/or the assessment component 202 (or other system components) utilizing in part inference-based schemes to facilitate learning and/or generating inferences associated with the determination of which signals of the one or more output signals represent a linear portion and which signals of the one or more output signals represent a non-linear portion in order to achieve improved processing performance and to output appropriate non-linear correction terms to the additional outputs of the array of analog memories.

The adjustment component 102 and/or the assessment component 202 can employ any suitable machine-learning based techniques, statistical-based techniques, and/or probabilistic-based techniques. For example, the adjustment component 102 and/or the assessment component 202 can employ expert systems, fuzzy logic, Support Vector Machines (SVMs), Hidden Markov Models (HMMs), greedy search algorithms, rule-based systems, Bayesian models (e.g., Bayesian networks), neural networks, other non-linear training techniques, data fusion, utility-based analytical systems, systems employing Bayesian models, etc. In another aspect, the adjustment component 102 and/or the assessment component 202 can perform a set of machine learning computations associated with facilitating decoupling of linear responses from non-linear responses and determining the non-linear correction term.

For example, the adjustment component 102 and/or the assessment component 202 can perform a set of clustering machine learning computations, a set of logistic regression machine learning computations, a set of decision tree machine learning computations, a set of random forest machine learning computations, a set of regression tree machine learning computations, a set of least square machine learning computations, a set of instance-based machine learning computations, a set of regression machine learning computations, a set of support vector regression machine learning computations, a set of k-means machine learning computations, a set of spectral clustering machine learning computations, a set of rule learning machine learning computations, a set of Bayesian machine learning computations, a set of deep Boltzmann machine computations, a set of deep belief network computations, and/or a set of different machine learning computations to facilitate detection of conversation threads in a messaging channel.

Figure 4:
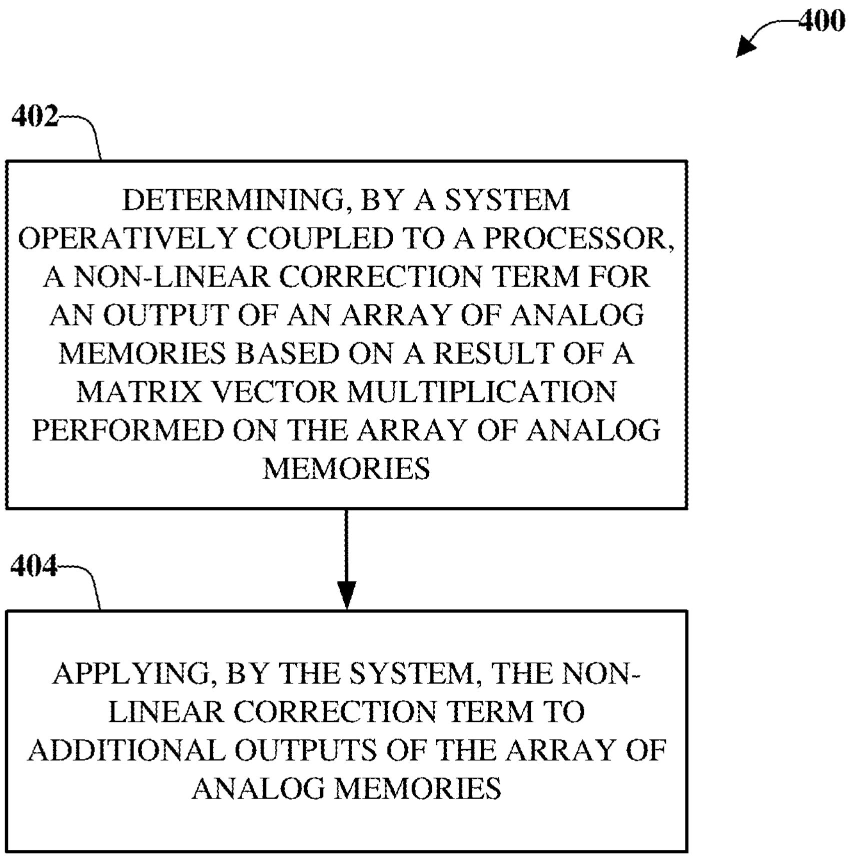
FIG. 4 illustrates a flow diagram of an example, non-limiting, computer-implemented method that facilitates automatic non-linearity correction for analog hardware in accordance with one or more embodiments described herein.

FIG. 4 illustrates a flow diagram of an example, non-limiting, computer-implemented method 400 that facilitates automatic non-linearity correction for analog hardware in accordance with one or more embodiments described herein. Repetitive description of like elements employed in other embodiments described herein is omitted for sake of brevity.

At 402 of the computer-implemented method 400, a system operatively coupled to a processor can determine a non-linear correction term for an output of an array of analog memories (e.g., via the adjustment component 102). The determination of the non-linear correction term can be based on a result of a matrix vector multiplication performed on the array of analog memories.

Further, at 404 of the computer-implemented method 400, the system can apply the non-linear correction term to additional outputs of the array of analog memories (e.g., via the rectification component 104). For example, the determination of the non-linear correction term can be based on random inputs applied to input lines of the array of analog memories, resulting in first outputs. Thereafter, when other inputs are applied to the input lines of the array of analog memories, second outputs are generated, and the non-linear correction term can be applied to those second outputs (and subsequent outputs).

Figure 5:
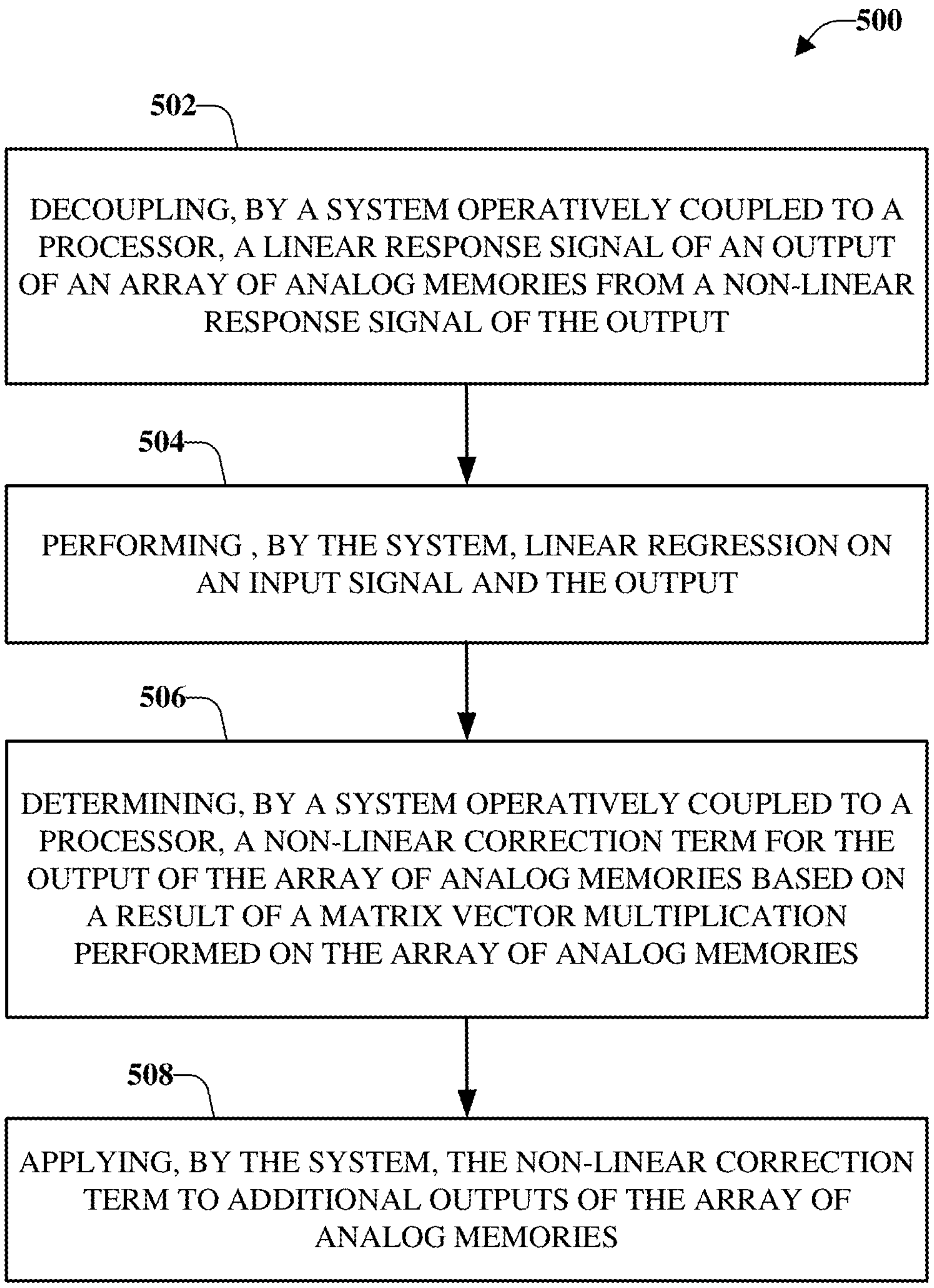
FIG. 5 illustrates a flow diagram of an example, non-limiting, computer-implemented method that facilitates decoupling linear response signals from non-linear response signals of outputs of analog hardware in accordance with one or more embodiments described herein.

FIG. 5 illustrates a flow diagram of an example, non-limiting, computer-implemented method 500 that facilitates decoupling linear response signals from non-linear response signals of outputs of analog hardware in accordance with one or more embodiments described herein. Repetitive description of like elements employed in other embodiments described herein is omitted for sake of brevity.

At 502 of the computer-implemented method 500, a system operatively coupled to a processor can, decouple a linear response signal of an output of the analog hardware from a non-linear response signal of an output of the analog hardware (e.g., via the decouple component 306). The linear response signal is integrated with the non-linear response signal. At 504, the system can perform linear regression on an input signal (e.g., one or more random signals) and the output (e.g., via the decouple component 306).

Further, at 506 of the computer-implemented method 500, the system can determine a non-linear correction term for an output of an array of analog memories (e.g., via the adjustment component 102). For example, the determination of the non-linear correction term can be based on a result of a matrix vector multiplication performed on the array of analog memories. Additionally, at 508 the system can apply the non-linear correction term to additional outputs of the array of analog memories (e.g., via the rectification component 104).

Figure 6:
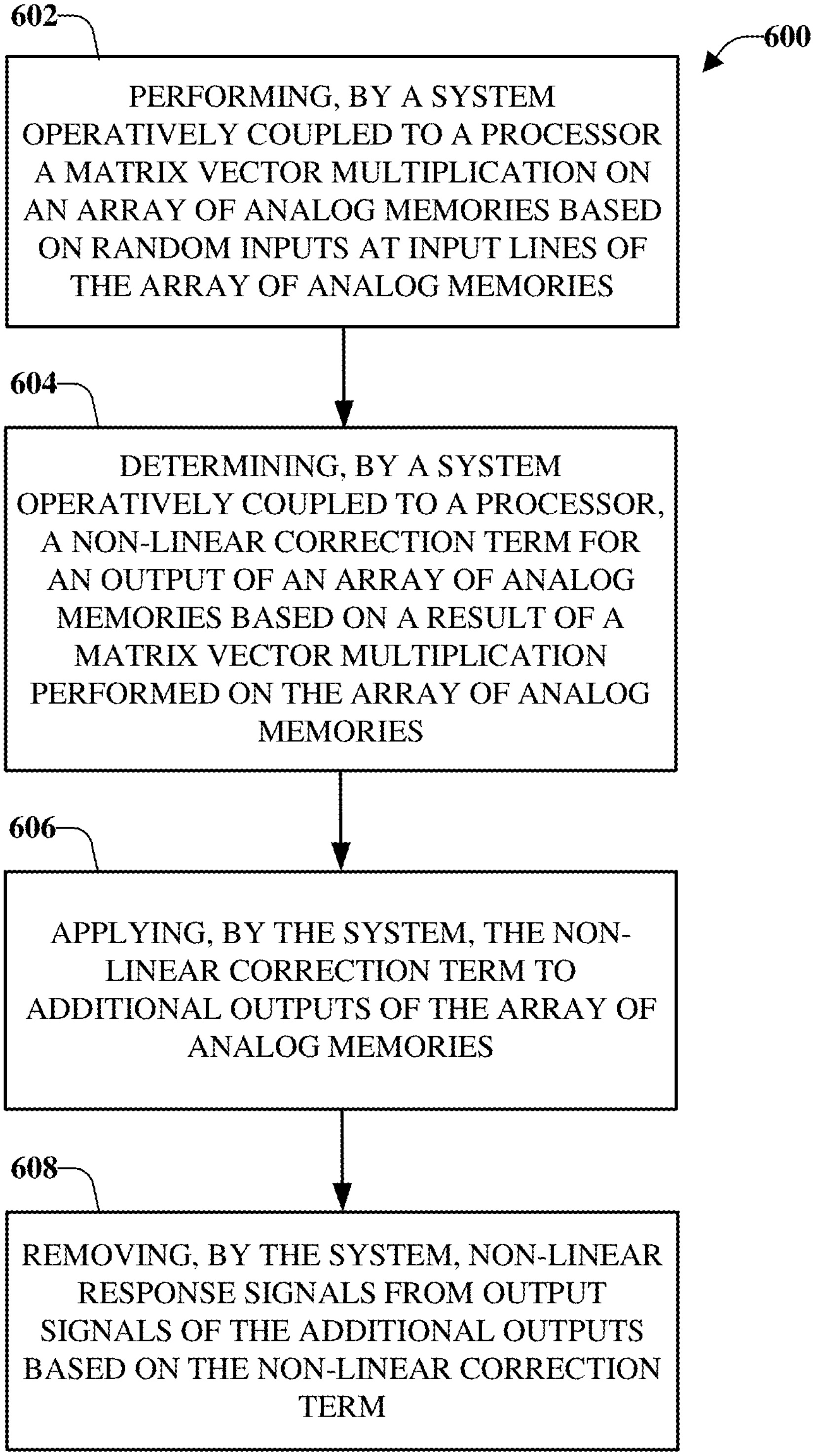
FIG. 6 illustrates a flow diagram of an example, non-limiting, computer-implemented method that facilitates decoupling linear response signals from non-linear response signals of subsequent outputs of analog hardware in accordance with one or more embodiments described herein.

FIG. 6 illustrates a flow diagram of an example, non-limiting, computer-implemented method 600 that facilitates decoupling linear response signals from non-linear response signals of subsequent outputs of analog hardware in accordance with one or more embodiments described herein. Repetitive description of like elements employed in other embodiments described herein is omitted for sake of brevity.

At 602 of the computer-implemented method 600, a system operatively coupled to a processor can perform a matrix vector multiplication on an array of analog memories based on random inputs at input lines of the array of analog memories (e.g., via the test component 302). The random inputs can be a multitude of random inputs (e.g., 100 inputs, 10,000 inputs, 100,000 inputs, and so on). The determination of the number of random inputs to be applied to the input lines of the array of analog memories can be based on a defined granularity level for error correction and/or a defined processing time.

At 604, the system can determine a non-linear correction term for an output of an array of analog memories (e.g., via the adjustment component 102). The determination of the non-linear correction term can be based on a result of the matrix vector multiplication performed on the array of analog memories.

Further, at 606 the system applies the non-linear correction term to additional outputs of the array of analog memories (e.g., via the rectification component 104). For example, the non-linear correction term is applied in a digital domain for correction of an error in an analog domain.

At 608 of the computer-implemented method 600, the system can remove non-linear response signals from output signals of the additional outputs based on the non-linear correction term (e.g., via the rectification component 104). As an example, the determination of the non-linear correction term, at 604, can be based on random inputs applied to input lines of the array of analog memories, resulting in first outputs. Thereafter, when subsequent inputs are applied to the input lines of the array of analog memories and subsequent outputs are generated, the non-linear correction term can be applied to those subsequent outputs. For example, the array of analog memories can comprise a set of output lines. The output is a first output at a first output line of the array of analog memories. Thus, the system can determine respective non-linear correction terms for outputs of the additional outputs.

Figure 7:
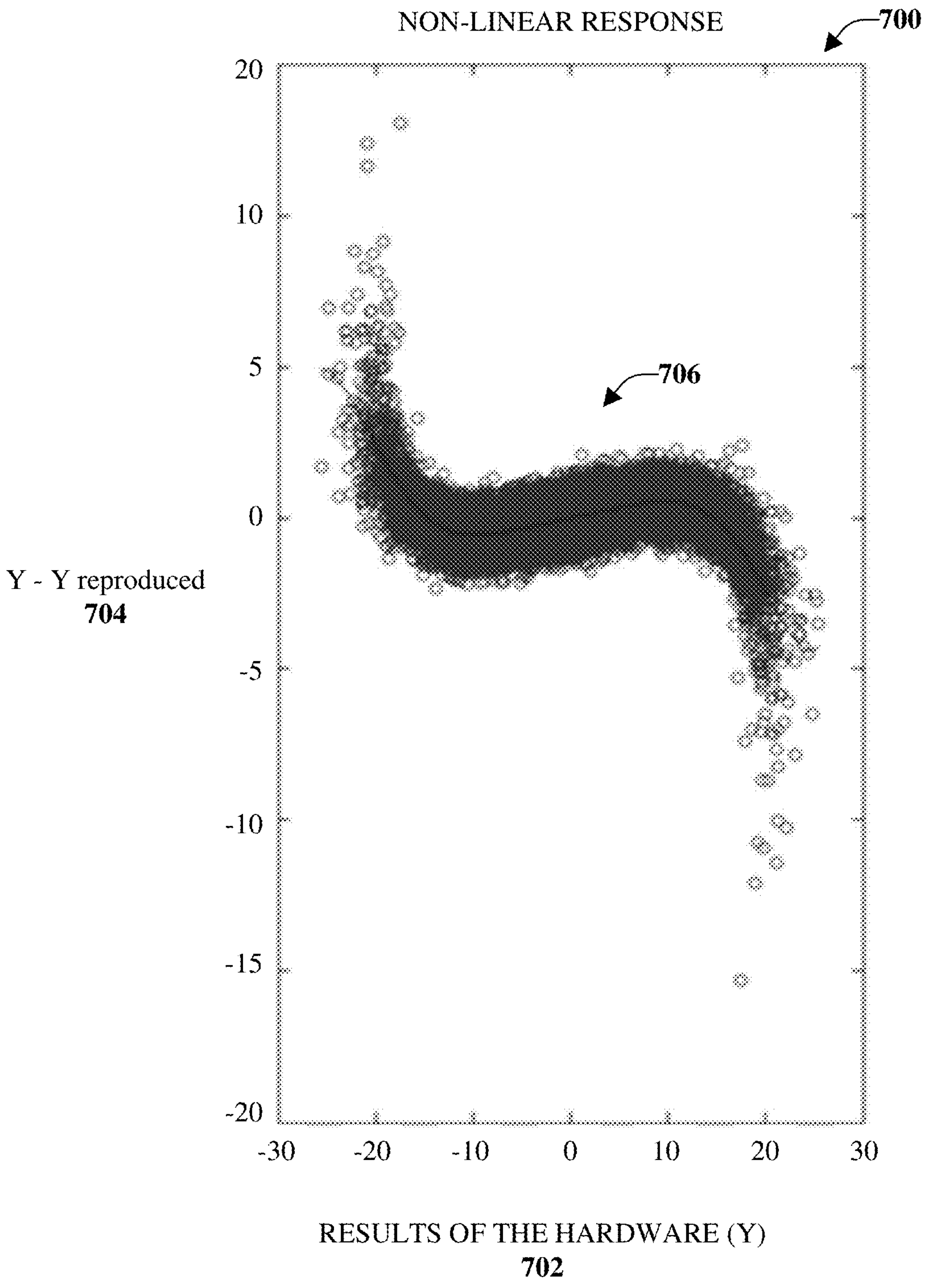
FIG. 7 illustrates an example, non-limiting, chart of a non-linear response at an output of analog hardware in accordance with one or more embodiments described herein.

FIG. 7 illustrates an example, non-limiting, chart 700 of a non-linear response at an output of analog hardware in accordance with one or more embodiments described herein. The outputs of the hardware (e.g., the term Y in equation 1 and equation 2 discussed herein) are depicted on the horizontal axis 702. The outputs are the one or more signals output at the output lines of the analog hardware. The results of the hardware are depicted on a scale between −30 and +30. Further, results of the output of the hardware minus the reproduced output of the hardware (e.g., Y minus Y-reproduced) are depicted on the vertical axis 704, which has a scale between −20 and +20.

As illustrated by the plot 706, when a non-linear response is input into the analog hardware, a shape representing the output is in the form of an s-shape, for example. Thus, the output overestimates the signal or underestimates the signal depending on the input range.

Figure 8:
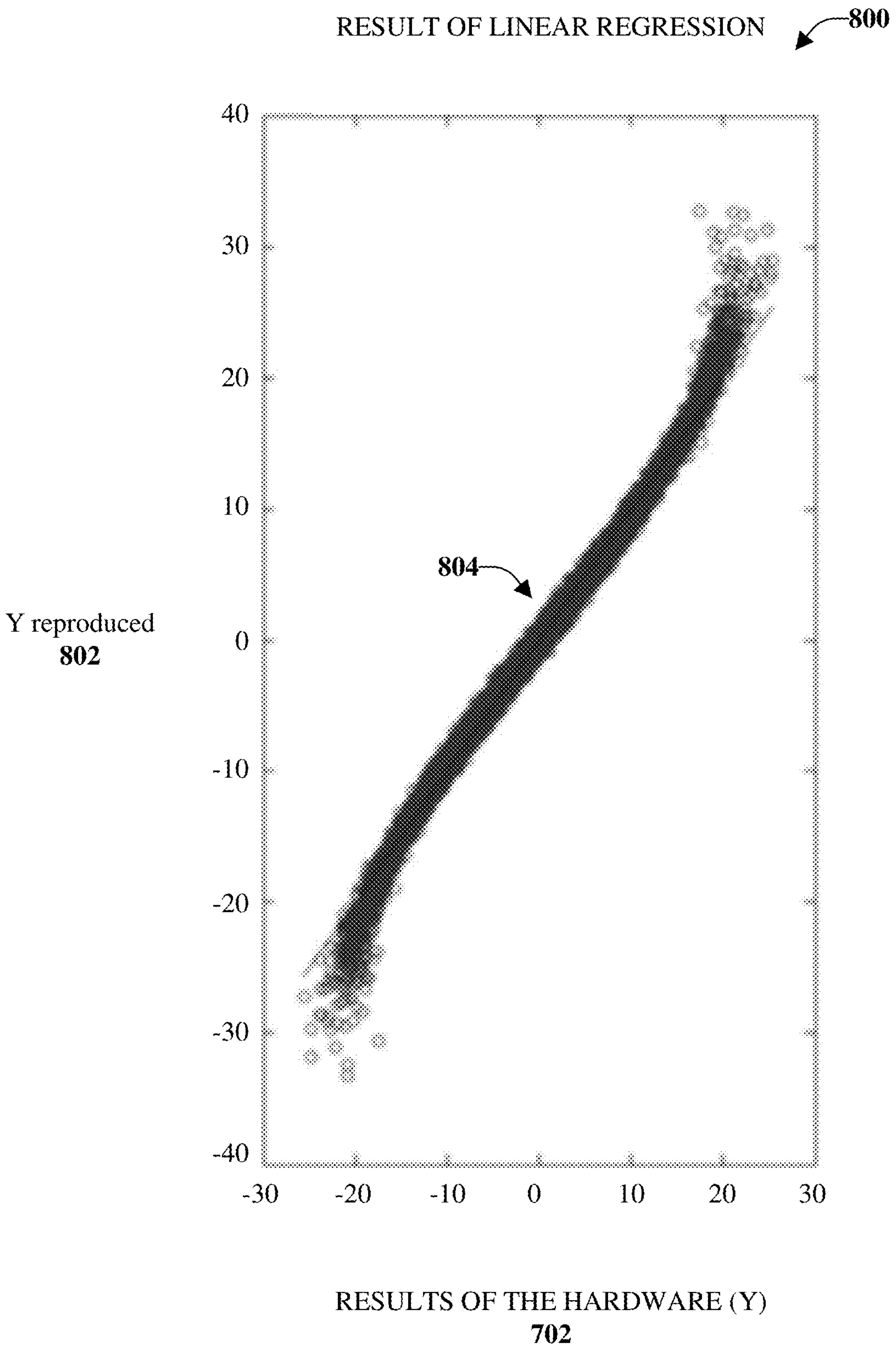
FIG. 8 illustrates an example, non-limiting, chart of a result of linear regression in accordance with one or more embodiments described herein.

FIG. 8 illustrates an example, non-limiting, chart 800 of a result of linear regression in accordance with one or more embodiments described herein. Repetitive description of like elements employed in other embodiments described herein is omitted for sake of brevity.

The outputs of the hardware are depicted on the horizontal axis 702. Further Y-reproduced is depicted on the vertical axis 802 with a scale of between −40 and +40. The plot 804 illustrates the results after the output is force fit with a straight line. In this case, the linear portion has been extracted. Thus, the non-linear portion is only represented in FIG. 7. For example, the s-shape of the plot 706 is fitted with a polynomial and that fit data is subtracted from the data obtained from the hardware (e.g., the outputs of the hardware).

Figure 9:
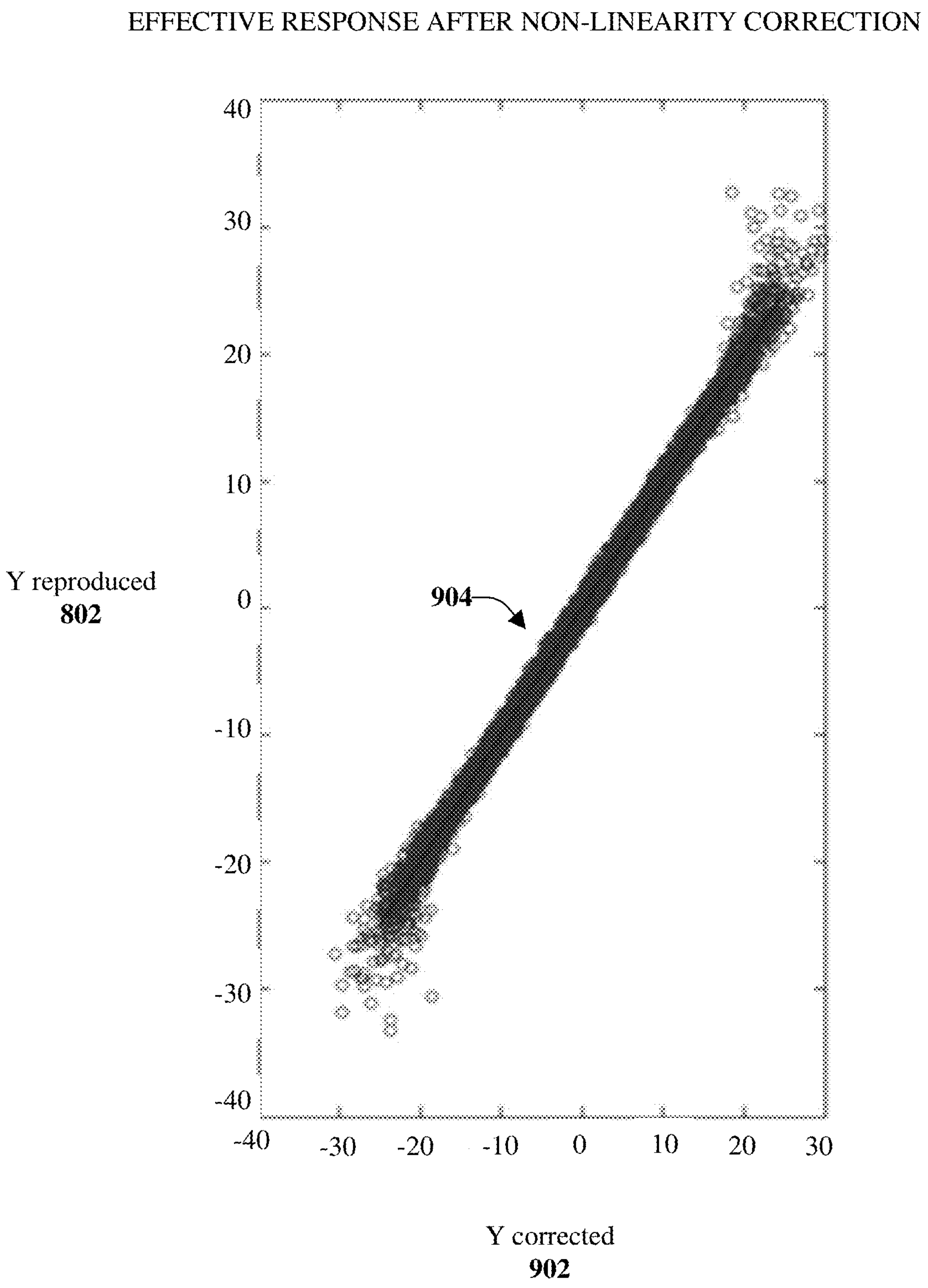
FIG. 9 illustrates an example, non-limiting, chart of an effective response after non-linearity correction in accordance with one or more embodiments described herein.

FIG. 9 illustrates an example, non-limiting, chart 900 of an effective response after non-linearity correction in accordance with one or more embodiments described herein. Repetitive description of like elements employed in other embodiments described herein is omitted for sake of brevity.

Y-corrected is depicted on the horizontal axis 902 with a range of −30 to +30. Further, Y-reproduced is depicted on the vertical axis 802. The plot 904 represents the output of the analog hardware after the correction term, as discussed herein, is applied. Thus, the output, as a whole, resembles a linear output after application of the correction term.

As discussed herein the disclosed embodiments determine and correct for the non-linear response from an analog crossbar matrix multiple engine. The determination and the non-linear correction can be made regardless of the source of the non-linear response. For example, the source of the non-linear response can be, but is not limited to, ADC, integration circuitry, non-linearity introduced during the analog matrix multiplication performed by the crossbar array, and so on. Additionally, the correction is applied after the ADC conversion in the digital domain, which allows for universal correction.

For simplicity of explanation, the computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Figure 10:
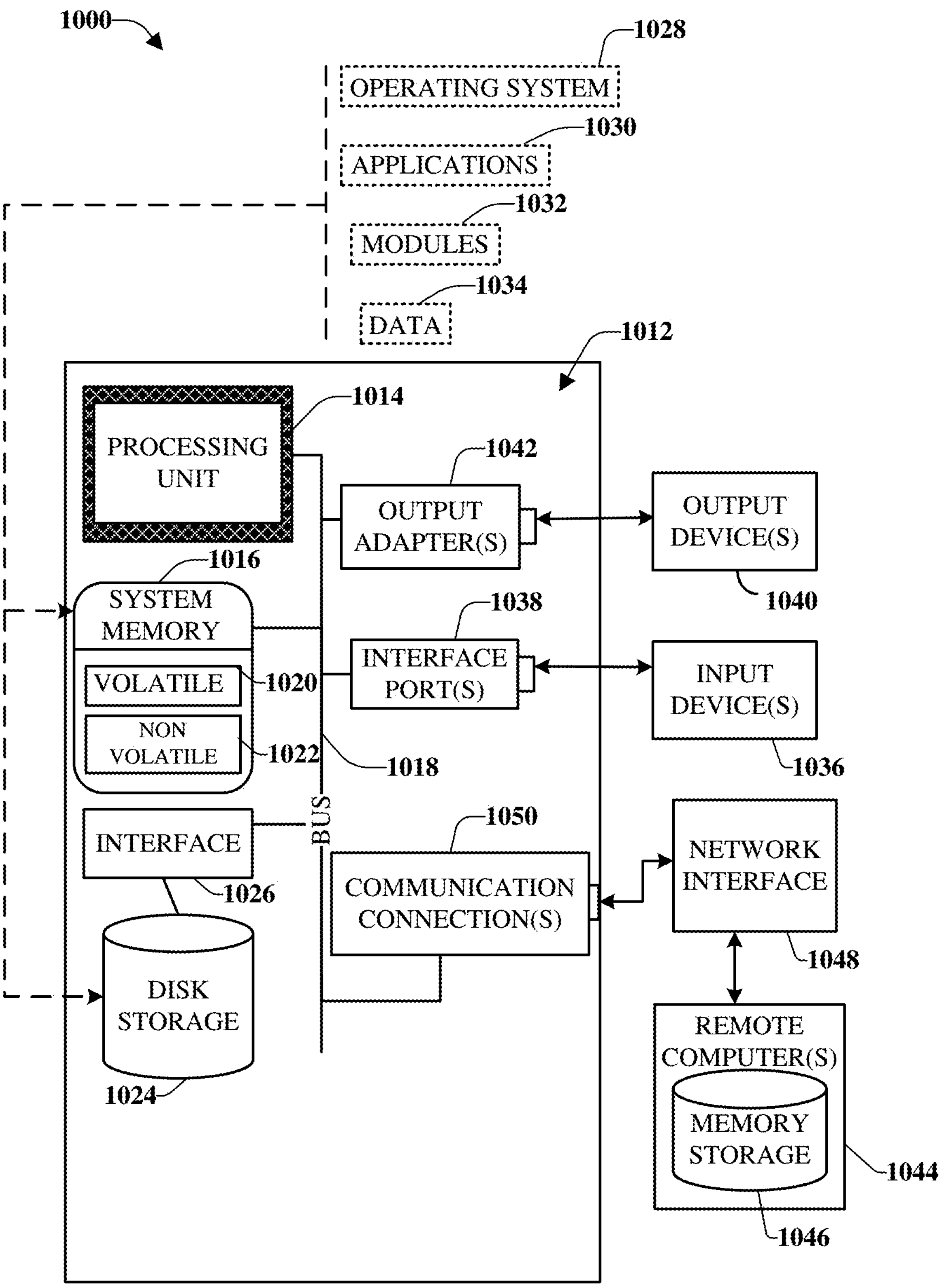
FIG. 10 illustrates a block diagram of an example, non-limiting operating environment in which one or more embodiments described herein can be facilitated.

In order to provide a context for the various aspects of the disclosed subject matter, FIG. 10 as well as the following discussion are intended to provide a general description of a suitable environment in which the various aspects of the disclosed subject matter can be implemented. FIG. 10 illustrates a block diagram of an example, non-limiting operating environment in which one or more embodiments described herein can be facilitated. Repetitive description of like elements employed in other embodiments described herein is omitted for sake of brevity. With reference to FIG. 10, a suitable operating environment 1000 for implementing various aspects of this disclosure can also include a computer 1012. The computer 1012 can also include a processing unit 1014, a system memory 1016, and a system bus 1018. The system bus 1018 couples system components including, but not limited to, the system memory 1016 to the processing unit 1014. The processing unit 1014 can be any of various available processors. Dual microprocessors and other multiprocessor architectures also can be employed as the processing unit 1014. The system bus 1018 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), Video Electronics Standards Association (VESA)Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI). The system memory 1016 can also include volatile memory 1020 and nonvolatile memory 1022. The basic input/output system (BIOS), containing the basic routines to transfer information between elements within the computer 1012, such as during start-up, is stored in nonvolatile memory 1022. By way of illustration, and not limitation, nonvolatile memory 1022 can include Read Only Memory (ROM), Programmable ROM (PROM), Electrically Programmable ROM (EPROM), Electrically Erasable Programmable ROM (EEPROM), flash memory, or nonvolatile Random Access Memory (RAM) (e.g., Ferroelectric RAM (FeRAM)). Volatile memory 1020 can also include RAM, which acts as external cache memory. By way of illustration and not limitation, RAM is available in many forms such as Static RAM (SRAM), Dynamic RAM (DRAM), Synchronous DRAM (SDRAM), Double Data Rate SDRAM (DDR SDRAM), Enhanced SDRAM (ESDRAM), Synchlink DRAM (SLDRAM), Direct Rambus RAM (DRRAM), direct Rambus dynamic RAM (DRDRAM), and Rambus dynamic RAM.

Computer 1012 can also include removable/non-removable, volatile/non-volatile computer storage media. FIG. 10 illustrates, for example, a disk storage 1024. Disk storage 1024 can also include, but is not limited to, devices like a magnetic disk drive, floppy disk drive, tape drive, Jaz drive, Zip drive, LS-100 drive, flash memory card, or memory stick. The disk storage 1024 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1024 to the system bus 1018, a removable or non-removable interface is typically used, such as interface 1026. FIG. 10 also depicts software that acts as an intermediary between users and the basic computer resources described in the suitable operating environment 1000. Such software can also include, for example, an operating system 1028. Operating system 1028, which can be stored on disk storage 1024, acts to control and allocate resources of the computer 1012. System applications 1030 take advantage of the management of resources by operating system 1028 through program modules 1032 and program data 1034, e.g., stored either in system memory 1016 or on disk storage 1024. It is to be appreciated that this disclosure can be implemented with various operating systems or combinations of operating systems. A user enters commands or information into the computer 1012 through input device(s) 1036. Input devices 1036 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1014 through the system bus 1018 via interface port(s) 1038. Interface port(s) 1038 include, for example, a serial port, a parallel port, a game port, and a universal serial bus (USB). Output device(s) 1040 use some of the same type of ports as input device(s) 1036. Thus, for example, a USB port can be used to provide input to computer 1012, and to output information from computer 1012 to an output device 1040. Output adapter 1042 is provided to illustrate that there are some output devices 1040 like monitors, speakers, and printers, among other output devices 1040, which require special adapters. The output adapters 1042 include, by way of illustration and not limitation, video and sound cards that provide a method of connection between the output device 1040 and the system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. The remote computer(s) 1044 can be a computer, a server, a router, a network PC, a workstation, a microprocessor based appliance, a peer device or other common network node and the like, and typically can also include many or all of the elements described relative to computer 1012. For purposes of brevity, only a memory storage device 1046 is illustrated with remote computer(s) 1044. Remote computer(s) 1044 is logically connected to computer 1012 through a network interface 1048 and then physically connected via communication connection 1050. Network interface 1048 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1050 refers to the hardware/software employed to connect the network interface 1048 to the system bus 1018. While communication connection 1050 is shown for illustrative clarity inside computer 1012, it can also be external to computer 1012. The hardware/software for connection to the network interface 1048 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the “C” programming language or similar programming languages. The computer readable program instructions can execute entirely on the user’s computer, partly on the user’s computer, as a stand-alone software package, partly on the user’s computer and partly on a remote computer or entirely on the remote computer or server. In the latter scenario, the remote computer can be connected to the user’s computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create method for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other method to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include ROM, PROM, EPROM, EEPROM, flash memory, or nonvolatile RAM (e.g., FeRAM. Volatile memory can include RAM, which can act as external cache memory, for example. Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
an array of analog memories;
a memory that stores computer executable components; and
a processor that executes at least one of the computer executable components that:
determines, during a calibration phase, based on an output resulting from a matrix vector multiplication performed on the array of analog memories, a non-linear correction term that is applicable to additional outputs of the array of analog memories, wherein the array of analog memories represents analog memories of an analog device, wherein the output and the additional outputs represent current signals, and wherein determining the non-linear correction term comprises:
selecting a quantity of random input vectors based on a granularity level desired for the non-linear correction term;
receiving the quantity of random input vectors;
applying the random input vectors at input lines of the array of
analog memories;
performing linear regression on the random input vectors and corresponding calibration outputs of output lines of the array of analog memories to estimate a linear transfer matrix that represents an intended linear response of the array of analog memories; and
for each output line of the array of analog memories:
determining a residual non-linear response as a function of an output signal at the output line based on a difference between the calibration outputs and outputs predicted by the linear transfer matrix, and
fitting a stored non-linear inverse transfer function that maps an observed output signal at the output line to a corrected output signal that compensates for the residual non-linear response; and
applies the non-linear correction term to the additional outputs of the array of analog memories, wherein the applying comprises:
for each additional output of each output line of the output lines, digitally evaluating the stored non-linear inverse transfer function for that output line on a digital representation of the additional output, to generate a corrected output that is substantially linear with respect to an input applied to the array of analog memories.

2. The system of claim 1, wherein the output resulting from the matrix vector multiplication comprises one or more linear response signals integrated with one or more non-linear response signals.

3. The system of claim 2, wherein determining the non-linear correction term further comprises:
decoupling the one or more linear response signals from the one or more non-linear response signals by performing the linear regression on the random input vectors and the calibration outputs of the array of analog memories to obtain the linear transfer matrix; and
analyzing based on the decoupling, the outputs and the one or more linear response signals to determine, for each output line of the array of analog memories, the stored non-linear inverse transfer function that, when applied to subsequent outputs at that output line, cancels the one or more non-linear response signals.

4. The system of claim 1, wherein applying the non-linear correction term to the additional outputs removes non-linear response signals comprised within the additional outputs.

5. The system of claim 1, wherein the output is generated at a first output line comprised within the output lines.

6. The system of claim 1, wherein the non-linear correction term is applied to the additional outputs in a digital domain to correct an error introduced in an analog domain.

7. The system of claim 1, wherein a vector matrix multiply engine comprises the array of analog memories.

8. A computer-implemented method comprising:
determining, by a system comprising a processor, during a calibration phase, based on an output resulting from a matrix vector multiplication performed on an array of analog memories, a non-linear correction term that is applicable to additional outputs of the array of analog memories, wherein the array of analog memories represents analog memories of an analog device, wherein the output and the additional outputs represent current signals, and wherein the determining the non-linear correction term comprises:
selecting a quantity of random input vectors based on a granularity level desired for the non-linear correction term;
receiving the quantity of random input vectors;
applying the random input vectors at input lines of the array of analog memories;
performing linear regression on the random input vectors and corresponding calibration outputs of output lines of the array of analog memories to estimate a linear transfer matrix that represents an intended linear response of the array of analog memories; and
for each output line of the array of analog memories:
determining a residual non-linear response as a function of an output signal at the output line based on a difference between the calibration outputs and outputs predicted by the linear transfer matrix, and
fitting a stored non-linear inverse transfer function that maps an observed output signal at the output line to a corrected output signal that compensates for the residual non-linear response; and
applying, by the system, the non-linear correction term to the additional outputs of the array of analog memories, wherein the applying comprises:
for each additional output of each output line of the output lines, digitally evaluating the stored non-linear inverse transfer function for that output line on a digital representation of the additional output, to generate a corrected output that is substantially linear with respect to an input applied to the array of analog memories.

9. The computer-implemented method of claim 8, wherein the output resulting from the matrix vector multiplication comprises one or more linear response signals integrated with one or more non-linear response signals.

10. The computer-implemented method of claim 9, wherein the determining the non-linear correction term further comprises:
decoupling, by the system, the one or more linear response signals from the one or more non-linear response signals by performing the linear regression on the random input vectors and the calibration outputs of the array of analog memories to obtain the linear transfer matrix; and analyzing, by the system, based on the decoupling, the outputs and the one or more linear response signals to determine, for each output line of the array of analog memories, the stored non-linear inverse transfer function that, when applied to subsequent outputs at that output line, cancels the one or more non-linear response signals.

11. The computer-implemented method of claim 8, wherein the applying the non-linear correction term to the additional outputs removes non-linear response signals comprised within the additional outputs.

12. The computer-implemented method of claim 11, wherein the array of analog memories are analog memories of a vector matrix multiply engine.

13. The computer-implemented method of claim 8, wherein the output is generated at a first output line comprised within the output lines.

14. The computer-implemented method of claim 8, wherein the non-linear correction term is applied to the additional outputs in a digital domain to correct an error introduced in an analog domain.

15. A computer program product that facilitates non-linearity correction for analog hardware, the computer program product comprising a computer readable storage medium having program instructions embodied therewith, the program instructions are executable by a processor to cause the processor to:

determine, by the processor, during a calibration phase, based on an output resulting from a matrix vector multiplication performed on an array of analog memories, a non-linear correction term that is applicable to additional outputs of the array of analog memories, wherein the array of analog memories represents analog memories of an analog device, wherein the output and the additional outputs represent current signals, and wherein determining the non-linear correction term comprises:

selecting a quantity of random input vectors based on a granularity level desired for the non-linear correction term;

receiving the quantity of random input vectors;

applying the random input vectors at input lines of the array of analog memories;

performing linear regression on the random input vectors and corresponding calibration outputs of output lines of the array of analog memories to estimate a linear transfer matrix that represents an intended linear response of the array of analog memories; and for each output line of the array of analog memories:

determining a residual non-linear response as a function of an output signal at the output line based on a difference between the calibration outputs and outputs predicted by the linear transfer matrix, and fitting a stored non-linear inverse transfer function that maps an observed output signal at the output line to a corrected output signal that compensates for the residual non-linear response; and apply, by the processor, the non-linear correction term to the additional outputs of the array of analog memories, wherein the applying comprises:

for each additional output of each output line of the output lines, digitally evaluating the stored non-linear inverse transfer function for that output line on a digital representation of the additional output, to generate a corrected output that is substantially linear with respect to an input applied to the array of analog memories.

16. The computer program product of claim 15, wherein the output resulting from the matrix vector multiplication comprises one or more linear response signals integrated with one or more non-linear response signals.

17. The computer program product of claim 16, wherein the program instructions are further executable by the processor to cause the processor to:

decouple, by the processor, the one or more linear response signals from the one or more non-linear response signals by performing the linear regression on the random input vectors and the calibration outputs of the array of analog memories to obtain the linear transfer matrix; and analyze, by the processor, based on decoupling, the outputs and the one or more linear response signals to determine, for each output line of the array of analog memories, the stored non-linear inverse transfer function that, when applied to subsequent outputs at that output line, cancels the one or more non-linear response signals.

18. The computer program product of claim 15, wherein the non-linear correction term is applied to the additional outputs in a digital domain to correct an error introduced in an analog domain.

19. The computer program product of claim 15, wherein the output is generated at a first output line comprised within the output lines.

20. The computer program product of claim 15, wherein the non-linear correction term is applied to the additional outputs in a digital domain to correct an error introduced in an analog domain.

* * * * *